United States Patent
Sakurai

(10) Patent No.: US 11,208,718 B2
(45) Date of Patent: Dec. 28, 2021

(54) EPITAXIAL GROWTH DEVICE, PRODUCTION METHOD FOR EPITAXIAL WAFER, AND LIFT PIN FOR EPITAXIAL GROWTH DEVICE

(71) Applicant: SUMCO CORPORATION, Tokyo (JP)

(72) Inventor: Masaya Sakurai, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 301 days.

(21) Appl. No.: 15/574,624

(22) PCT Filed: Apr. 25, 2016

(86) PCT No.: PCT/JP2016/002174
§ 371 (c)(1),
(2) Date: Nov. 16, 2017

(87) PCT Pub. No.: WO2016/194291
PCT Pub. Date: Dec. 8, 2016

(65) Prior Publication Data
US 2018/0135166 A1    May 17, 2018

(30) Foreign Application Priority Data

May 29, 2015 (JP) .............................. JP2015-109937

(51) Int. Cl.
*C23C 16/24* (2006.01)
*C30B 25/12* (2006.01)
(Continued)

(52) U.S. Cl.
CPC ............ *C23C 16/24* (2013.01); *C23C 16/458* (2013.01); *C23C 16/4581* (2013.01);
(Continued)

(58) Field of Classification Search
CPC ... C23C 16/24; C23C 16/458; C23C 16/4581; C30B 25/08; C30B 25/12; C30B 29/06;
(Continued)

(56) References Cited

U.S. PATENT DOCUMENTS 6,596,086 B1   7/2003  Honma et al.
7,214,271 B2   5/2007  Kono et al.
(Continued)

FOREIGN PATENT DOCUMENTS

CN   1956145 A     5/2007
DE   60223514 T2   9/2008
(Continued)

OTHER PUBLICATIONS

Office Action issued in Republic of Korea family member Patent Appl. No. 10-2017-7033450, dated Apr. 17, 2019, along with an English translation thereof.

(Continued)

*Primary Examiner* — Hua Qi
(74) *Attorney, Agent, or Firm* — Greenblum & Bernstein, P.L.C.

(57) ABSTRACT

An epitaxial growth device includes; a chamber; a susceptor; a supporting shaft, having a main column located coaxially with the center of the susceptor and supporting arms; and a lift pin, at least the surface layer region of the lift pin is made of a material having a hardness lower than the susceptor, the lift pin has a straight trunk part upper region configured to pass through the through-hole of the susceptor and having a surface roughness of from not less than 0.1 μm to not more than 0.3 μm, and the lift pin has a straight trunk part lower region configured to pass through the through-hole of the supporting arm and having a surface roughness of from not less than 1 μm to not more than 10 μm.

5 Claims, 5 Drawing Sheets

(51) Int. Cl.
*C30B 29/06* (2006.01)
*H01L 21/687* (2006.01)
*C30B 25/08* (2006.01)
*C23C 16/458* (2006.01)
*H01L 21/02* (2006.01)
*H01L 21/205* (2006.01)

(52) U.S. Cl.
CPC .............. *C30B 25/08* (2013.01); *C30B 25/12* (2013.01); *C30B 29/06* (2013.01); *H01L 21/02293* (2013.01); *H01L 21/205* (2013.01); *H01L 21/68742* (2013.01)

(58) Field of Classification Search
CPC ............. H01L 21/02293; H01L 21/205; H01L 21/67115; H01L 21/68742
See application file for complete search history.

(56) References Cited

U.S. PATENT DOCUMENTS

| | | | |
|---|---|---|---|
| 2003/0075109 A1* | 4/2003 | Arai | C23C 16/4581 118/728 |
| 2004/0241992 A1* | 12/2004 | Kono | C30B 25/12 438/689 |
| 2006/0219178 A1 | 10/2006 | Asakura | |
| 2007/0089836 A1 | 4/2007 | Metzner et al. | |
| 2007/0160507 A1 | 7/2007 | Satoh et al. | |
| 2011/0056436 A1* | 3/2011 | Van Munster | C23C 16/4581 118/729 |
| 2011/0315080 A1 | 12/2011 | Choi et al. | |

FOREIGN PATENT DOCUMENTS

| | | |
|---|---|---|
| JP | 2000-026192 A | 1/2000 |
| JP | 2002-299260 A | 10/2002 |
| JP | 2003-100855 A | 4/2003 |
| JP | 2003-142407 A | 5/2003 |
| JP | 2003142407 A * | 5/2003 |
| JP | 2004-343032 A | 12/2004 |
| JP | 3672300 B2 | 7/2005 |
| JP | 2007-189222 A | 7/2007 |
| JP | 2009-513027 A | 3/2009 |
| JP | 2009-197331 A | 9/2009 |
| JP | 2011-505691 A | 2/2011 |
| JP | 2016-092129 A | 5/2016 |
| JP | 2016-092130 A | 5/2016 |
| KR | 10-2010-0100269 A | 9/2010 |

OTHER PUBLICATIONS

U.S. Appl. No. 15/567,148 to Shoji Nogami et al., which was filed on Oct. 17, 2017.
U.S. Appl. No. 15/567,159 to Shoji Nogami et al., which was filed on Oct. 17, 2017.
Official Communication issued in WIPO Patent Application No. PCT/JP2016/002174, dated Jul. 19, 2016.
Official Communication issued in WIPO Patent Application No. PCT/JP2016/002174, dated Dec. 5, 2017.
German Office Action, German Patent Office, Application No. 11 2016 002 422.3, dated Mar. 27, 2020, with English translation.
Office Action issued in corresponding Chinese Patent Application 201680031564.9, dated Dec. 21, 2020 (with English translation).

* cited by examiner

EPITAXIAL GROWTH DEVICE, PRODUCTION METHOD FOR EPITAXIAL WAFER, AND LIFT PIN FOR EPITAXIAL GROWTH DEVICE

TECHNICAL FIELD

This disclosure relates to an epitaxial growth device, a production method for an epitaxial wafer, and a lift pin for an epitaxial growth device, and particularly relates to an epitaxial growth device, a production method for an epitaxial wafer, and a lift pin for an epitaxial growth device, which can reduce occurrence of scratches to the epitaxial silicon wafer back surface and can also reduce attachment of particles to the wafer surface.

BACKGROUND

Generally, in order to obtain a silicon wafer, a silicon single crystal is grown by Czochralski or CZ method, etc., and the silicon single crystal is cut into blocks, then sliced thin, subjected to a flat surface grinding or lapping step, an etching step, and a mirror surface polishing or polishing step, and finally washed. Thereafter, it is shipped as a product if various quality inspections observe no abnormality.

Here, when crystal integrity is further required, when a multi-layer structure of different resistivity is needed, or the like, an epitaxial wafer is produced by growing a single crystal silicon thin film on the silicon wafer by vapor phase growth or epitaxial growth.

For epitaxial wafer production, a single wafer type epitaxial growth device (apparatus) is used for example. Here, a typical single wafer type epitaxial growth device will be described with reference to FIG. 1. As illustrated in FIG. 1, an epitaxial growth device 100 has a chamber 2 surrounded by an upper dome 11, a lower dome 12, and a dome mounting body 13. This chamber 2 is provided with a gas supply opening 31 and a gas exhaust opening 32 for supplying and exhausting a reaction gas at opposing positions on the side surface thereof.

Meanwhile, a susceptor 4 for placing a silicon wafer W thereon is arranged within the chamber 2. The susceptor 4, the outer circumferential part of the lower surface of which is fitted to and supported by supporting arms 7b connected to a rotatable main column 7a, rotates with the supporting arm 7b. Moreover, through-holes 4h and 7h, through which lift pins 5 for ascending and descending the silicon wafer W pass, are formed in the susceptor 4 and the supporting arm 7b respectively, and each lift pin 5 is ascended and descended while being supported by an ascending/descending shaft 6 at the base end thereof.

More specifically, the silicon wafer W introduced into the chamber 2 moves each lift pin 5 inserted through the through-hole 4h of the susceptor 4 and the through-hole 7h of the supporting arm 7b towards above the susceptor 4, and the head part of each lift pin 5 is abut against the back surface of the silicon wafer W to temporarily support the silicon wafer W by the lift pin 5. Here, the ascending movement of each lift pin 5 is performed through the ascending movement of the ascending/descending shaft 6 supporting the base end of the lift pin 5.

Then, a supporting shaft 7 supporting the susceptor 4 is ascended, the susceptor 4 is moved to the position of the silicon wafer W, and the silicon wafer W is placed on the susceptor 4. In this state, the head part of each lift pin 5 is accommodated within the diametrically enlarged part, not illustrated, of the through-hole 4h of the susceptor 4. Thus, an epitaxial wafer is produced by placing the silicon wafer W on the susceptor 4, and while heating the silicon wafer W to a temperature not lower than 1000° C. by a plurality of heat lamps 14 arranged above and below the susceptor 4 for example, supplying a reaction gas into the epitaxial film forming chamber 2, and growing an epitaxial film having a predetermined thickness.

Thereafter, by descending the supporting arm 7b, the susceptor 4 is descended. This descending is performed up to a position in which each lift pin 5 is supported by the ascending/descending shaft 6 and protruding from the susceptor 4, and the silicon wafer W is supported by the lift pin 5. Then, a conveying blade, not illustrated, is introduced into the chamber 2, and the silicon wafer W is placed on the conveying blade by descending each lift pin 5 to pass the silicon wafer W from the lift pin 5 to the conveying blade. Subsequently, the silicon wafer W is discharged from the growth device 100 along with the conveying blade.

Due to microfabrication and high integration of semiconductor devices in recent years, reduction of crystal defects and particles attached to the wafer surface has been demanded. Under such a background, JP 2002-299260 A (PTL 1) describes that attachment of particles generated during epitaxial growth and formation of crystal defects can be reduced by paying attention to the amount of abrasion caused by a lift pin sliding, forming surfaces of lift pins and of a susceptor of silicon carbide, SiC, and polishing a region of the lift pin in contact with the susceptor to surface roughness of 0.2 μm to 5 μm.

CITATION LIST

Patent Literature

PTL 1: JP 2002-299260 A

SUMMARY

Technical Problem

In the disclosure of PTL 1, since the material of the lift pin surface is made of SiC, there is a problem that contact scratches occur in the back surface part of a wafer in contact with the top portions of lift pins when the lift pins ascend and descend.

More specifically, not limited to the disclosure of PTL 1, generally as the susceptor 4, from the perspectives of heat resistance and acid resistance, a carbon base material coated with SiC, a base material itself made of SiC, or the like is used, and similarly as the lift pins, a carbon base material coated with SiC, a base material made of SiC itself, or the like is used.

However, while SiC is excellent in heat resistance and acid resistance, the hardness thereof is high, and therefore in the case of using lift pins made of SiC, there is a problem that contact scratches or contact marks occur on the back surface of the wafer W, when the tip of each lift pin 5 and the back surface of the silicon wafer W contact each other. A current state of highly integrated devices is under a situation in which contact scratches to the wafer W back surface due to contact between the back surface of the silicon wafer W and each lift pin 5 are sought to be reduced as soon as possible, and provision of an epitaxial silicon wafer having back surface scratches reduced has been required.

Therefore, the purpose of this disclosure is to provide an epitaxial growth device, a production method for an epitaxial wafer, and a lift pin for an epitaxial growth device, which can reduce occurrence of scratches to the epitaxial silicon wafer back surface and can also reduce attachment of particles to the wafer surface.

Solution to Problem

The inventor conceived of reducing occurrence of scratches to the silicon wafer back surface by making the material of each lift pin 5 of a material having a hardness lower than SiC, and also reducing dust generation of particles by adjusting the surface roughness of each lift pin 5, and conducted various experiments to obtain the following findings.

Firstly, when each lift pin 5 was made of a material having a hardness lower than the susceptor 4, and subjected to epitaxial growth treatment, significant reduction in occurrence of contact scratches to the back surface of the silicon wafer W was observed, while increase in the amount of particles attached to the wafer surface was observed.

The inventor surmised that attachment of particles to the wafer surface was caused by generation of particles due to contact between the susceptor 4 and each lift pin 5, and conducted experiments using lift pins 5 having the smallest possible surface roughness of a region in contact with the susceptor 4 and excellent flatness. The results were that although the effect of reducing the amount of particles attached to the wafer surface was observed, frequent occurrence of an abnormal phenomenon of drastic increase in the amount of particles attached to the wafer surface was newly observed.

Since this drastic increase of particles suddenly occurred, it was presumed that some kind of trouble was occurring during epitaxial growth treatment. Therefore, the inventor observed whether or not the ascending/descending motion of each lift pin 5 was being carried out normally during epitaxial growth treatment. Specifically, experiments were conducted, in which with the chamber 2 being open, without flowing a raw material gas, etc., in a state of placing the silicon wafer W on the susceptor 4 at room temperature, operation of driving the ascending/descending shaft 6 to vertically ascend and descend the lift pins 5 was repeatedly carried out, and the ascending/descending motion of the lift pins 5 was visually observed.

As a result, a phenomenon was observed that when the lift pins 5 were descended downwards by descending the ascending/descending shaft 6, some of the lift pins 5 were caught within the through-holes 4h of the supporting arm 7b, and the lift pins 5 did not fully descend, and then vigorously dropped downwards after release from being caught.

As it was surmised that this abnormal motion of the lift pins 5 dropping was probably also occurring during epitaxial growth treatment, it was presumed that due to this phenomenon of the lift pins 5 dropping, dust generated from contact between each lift pin 5 and the susceptor 4 flew above the susceptor 4, and the amount of particles infiltrating into the surface of the silicon wafer W was suddenly increased.

Thus, the inventor intensively studied on methods for preventing the lift pins 5 from being caught on the supporting arm 7b and preventing attachment of particles to the wafer surface, discovered that it is effective to increase, rather than decrease, the surface roughness of the outer surface of each lift pin 5 in a part of the lift pin 5 that moves within the through-hole 7h of the supporting arm 7b larger. The present disclosure was completed based on this discovery.

The brief configuration of this disclosure is as follows.

1. An epitaxial growth device comprising: a chamber; a susceptor for placing a silicon wafer thereon within the chamber; a supporting shaft for supporting the susceptor from below, having a main column located coaxially with the center of the susceptor and supporting arms radially extending from the main column; and lift pins configured to be inserted through both through-holes provided in the susceptor and through-holes provided in the supporting arms, and arranged movably in the vertical direction so that the silicon wafer is attached and detached on the susceptor by ascending and descending the lift pins, wherein at least a surface layer region of each of the lift pins is made of a material having a hardness lower than the susceptor, each of the lift pins comprises a straight trunk part upper region configured to pass through the through-hole of the susceptor and having a surface roughness of from not less than 0.1 μm to not more than 0.3 μm, and each of the lift pins comprises a straight trunk part lower region configured to pass through the through-hole of the supporting arm and having a surface roughness of from not less than 1 μm to not more than 10 μm.

2. The epitaxial growth device according to the above item 1, wherein at least the surface layer region of each of the lift pins is made of glassy carbon, at least a surface layer region of the susceptor is made of silicon carbide, SiC, and the supporting arm is made of quartz.

3. The epitaxial growth device according to the above item 1 or 2, wherein each of the lift pins comprises a rounded lower end part.

4. A production method for an epitaxial wafer, wherein an epitaxial film is grown on a silicon wafer using the epitaxial growth device according to the above items 1 to 3.

5. A Lift pin for an epitaxial growth device, the lift pin being configured to be inserted through both one of through-holes provided in a susceptor arranged within an epitaxial growth device for growing an epitaxial layer on a silicon wafer by vapor phase growth and one of through-holes provided in supporting arms for supporting a lower part of the susceptor, and to be ascended and descended while supporting a back surface of the silicon wafer when the silicon wafer is carried into or out of the epitaxial growth device, wherein at least a surface layer region of the lift pin is made of a material having a hardness lower than the susceptor, and the lift pin comprises a straight trunk part lower region configured to pass through the one of the through-holes of the supporting arm and a straight trunk part upper region configured to pass through the one of the through-holes of the susceptor, the straight trunk part lower region having a surface roughness larger than a surface roughness of the straight trunk part upper region.

6. The lift pin for an epitaxial growth device according to the above item 5, wherein the surface roughness of the straight trunk part upper region is from not less than 0.1 μm to not more than 0.3 μm, and the surface roughness of the straight trunk part lower region is from not less than 1 μm to not more than 10 μm.

7. The lift pin for an epitaxial growth device according to the above item 5 or 6, wherein at least the surface layer region is made of glassy carbon.

8. The lift pin for an epitaxial growth device according to any one of the above items 5 to 7, wherein the lift pin comprises a rounded lower end part.

Advantageous Effect

According to this disclosure, occurrence of scratches to the epitaxial silicon wafer back surface can be reduced, and also attachment of particles to the wafer surface can be reduced.

BRIEF DESCRIPTION OF THE DRAWINGS

This disclosure will be further described with reference to the accompanying drawings, in which.

DETAILED DESCRIPTION

Below, with reference to the drawings, this disclosure will be described in detail.

Figure 1:
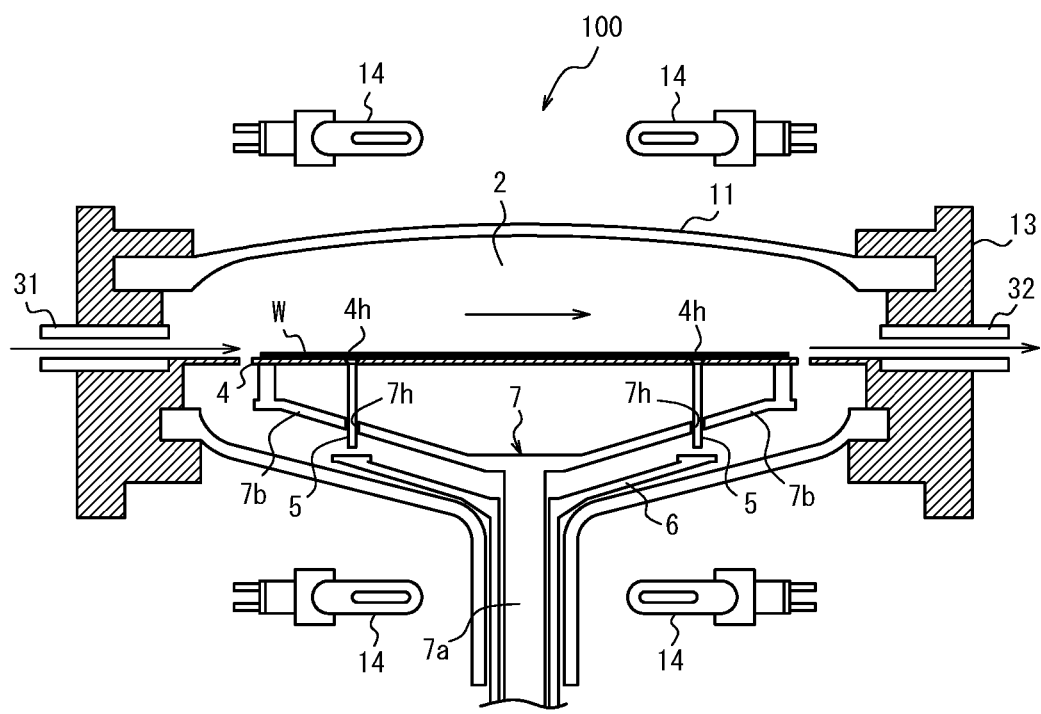
FIG. 1 is a view illustrating a typical epitaxial growth device.
Figure 2:
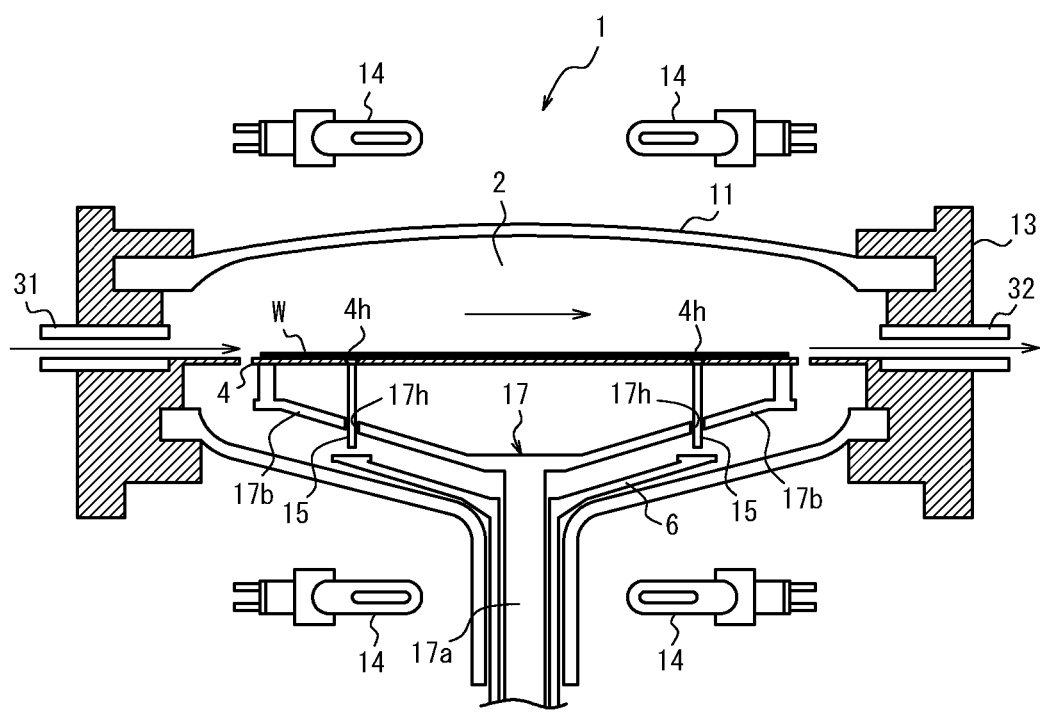
FIG. 2 is a view illustrating an epitaxial growth device according to this disclosure.
Figure 3:
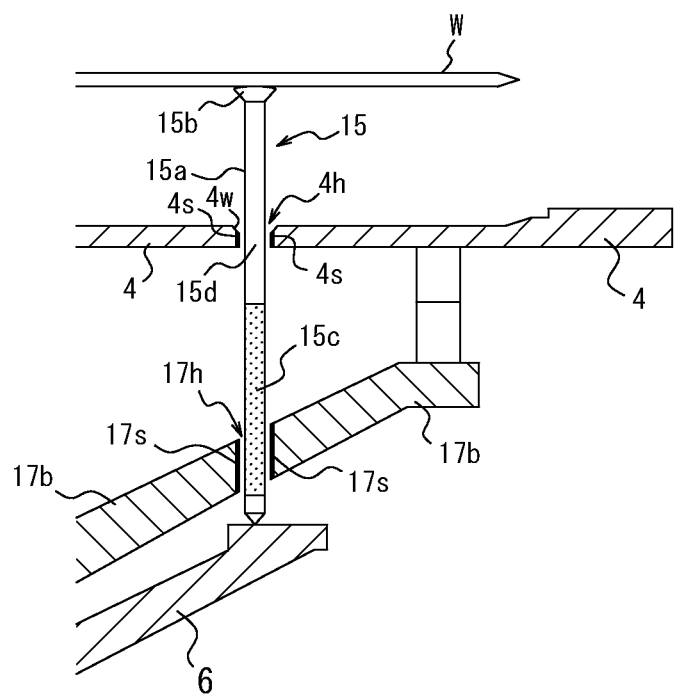
FIG. 3 is a view illustrating the peripheral region of a lift pin in an epitaxial growth device according to this disclosure.

FIG. 2 illustrates an epitaxial growth device 1 according to this disclosure having a supporting shaft 17. Moreover, FIG. 3 illustrates the peripheral region of a lift pin 15 in the epitaxial growth device 1. It should be noted that the same reference numeral refers to the same configuration, and the description will be omitted. As illustrated in FIG. 2 and FIG. 3, the epitaxial growth device 1 according to this disclosure has lift pins 15 made of a material having a harness lower than the susceptor 4, i.e., a soft material, and the lift pins 15 are configured to be inserted through respective through-holes 4h of the susceptor 4 and respective through-holes 17h of supporting arms 17b, and are arranged movably in the vertical direction.

As illustrated in FIG. 3, each lift pin 15 has a rod-shaped straight trunk part 15a and a head part 15b having a diameter larger than the straight trunk part 15a and the through-hole 4h, and the head part 15b is configured to be engaged with a diametrically enlarged part 4w of the through-hole 4h of the susceptor 4. Additionally, the shape of each lift pin is not necessary to be limited, as long as the lift pin has a head part directly supporting a silicon wafer in the tip end of the rod-shaped straight trunk part, and therefore is not limited to the illustrated shape.

As described above, each lift pin 15 is made of a material having a hardness lower than the susceptor 4, i.e., a soft material. Thereby, occurrence of contact scratches to the back surface of the wafer W can be substantially reduced. For the lift pin 15, specifically, glassy carbon, graphite, quartz, aluminum nitride, forsterite, cordierite, yttria, steatite, etc. can be used. Among them, glassy carbon is excellent in molding, and has high purity, and excellent heat resistance and acid resistance. It should be noted that it is not necessary to make the entire lift pin 15 of the above materials, as long as at least the surface layer region is made of a material softer than the surface material of the susceptor.

For example, each lift pin 15 can be made of a base material having a high hardness such as SiC coated with the above materials on the surface.

As the susceptor 4, from the perspectives of high purity, heat resistance durable for the use under a high temperature environment, and acid resistance, a carbon base material coated with SiC on the surface, a base material made of SiC itself, or the like is usually used.

In this disclosure, it is important that a region 15c on the straight trunk part 15a of each lift pin 15 configured to pass through the through-hole 17h of the supporting arm 17b, which region is hereinbelow referred to as "straight trunk part lower region", has a surface roughness of not less than 1 μm. As described above, in the case of making each lift pin of a material softer than the susceptor, some were found out to be caught within the through-holes of the supporting arms when descended downwards by descending the ascending/descending shaft.

Although the cause of being caught is not necessarily apparent, it is presumed that larger surface roughness of the lift pin 15 decreases the area in contact with the wall surface defining the through-hole of the supporting arm, therefore increases slidability within the through-hole, and as a result, can prevent occurrence of being caught.

Thus, in this disclosure, the surface roughness of the straight trunk part lower region 15c of each lift pin 15 configured to pass through the through-hole 17h of the supporting arm 17b is not less than 1 μm. Here, when the surface roughness of the straight trunk part lower region 15c was less than 1 μm, occurrence of being caught as described above could not be sufficiently prevented.

Moreover, the upper limit of the surface roughness of the straight trunk part lower region 15c of each lift pin 15 configured to pass through the through-hole 17h of the supporting arm 17b is not particularly limited in terms of preventing occurrence of being caught as described above, but is desirably not more than 10 μm in terms of easy processing to adjust the surface roughness. It should be noted that "surface roughness" in this disclosure means arithmetic average roughness Ra regulated in JIS B 0601, 2001.

Such surface roughness of each lift pin 15 can be adjusted by polishing treatment such as machining. Moreover, the surface roughness of a wall surface 17s within the through-hole 17h of the supporting arm 17b is generally adjusted by machining, etching, quenching, blast treatment, etc., and is adjusted to be a surface roughness of approximately not more than 0.5 μm.

Furthermore, in this disclosure, a region 15d on the straight trunk part 15a of each lift pin 15 configured to pass through the through-hole 4h of the susceptor 4, which region is hereinbelow referred to as "straight trunk part upper region", has a surface roughness of from not less than 0.1 μm to not more than 0.3 μm. In this disclosure, since each lift pin 15 is made of a material softer than the susceptor 4, by making the surface roughness of the straight trunk part upper region 15d of each lift pin 15 configured to pass through the through-hole 4h of the susceptor 4 to be not more than 0.3 μm, the above mentioned effect of preventing dust generation can be achieved. Moreover, by making the surface roughness to be not less than 0.1 μm, occurrence of dust generation can be effectively prevented without increasing the processing cost.

Additionally, since the lower surface part of the head part 15b of each lift pin contacts the diametrically enlarged part 4w of the through-hole 4h of the susceptor 4, the surface roughness of the lower surface part of the head part 15b is preferable to be not more than 0.3 µm.

Thus, each lift pin 15 according to this disclosure has different surface roughness between the straight trunk part upper region 15d configured to pass through the through-hole 4h of the susceptor 4 and the straight trunk part lower region 15c configured to pass through the through-hole 17h of the supporting arm 17b, and the surface roughness of the straight trunk part lower region 15c is made to be larger than the surface roughness of the straight trunk part upper region 15d.

In addition, the surface roughness of the wall surface 4s defining the through-hole 4h of the susceptor 4 is also preferable to be from not less than 0.1 µm to not more than 0.3 µm. Thereby, the effect of preventing dust generation can be further enhanced.

Moreover, it is preferable that each lift pin 15 has a rounded lower end part. As described above, the lift pin 15 is inserted through both the through-hole 4h of the susceptor 4 and the through-hole 17h of the supporting arm 17b, and is configured to be able to move in the vertical direction. In this regard, a slight gap or clearance is provided between each lift pin 15 and the corresponding through-holes 4h and 17h, so that the lift pin 15 can move smoothly within the through-holes 4h and 17h.

Therefore, when a lift pin 15 performs the ascending/descending motion, the lift pin 15 may be inclined and deviate from the trajectory of the ascending/descending motion. However, by rounding the lower end part of each lift pin 15 to have roundness, each lift pin 15 can recover to the trajectory of the ascending/descending motion. This setup makes it possible to prevent dust from being generated by sliding between each lift pin 15 and the susceptor 4 due to deviation from the trajectory.

Thus, according to this disclosure, occurrence of scratches to the epitaxial silicon wafer back surface can be reduced, and also attachment of particles to the wafer surface can be prevented.

EXAMPLES

Preparation of Lift Pins

Eight types of lift pins were prepared for Examples 1 to 4 and Comparative Examples 1 to 4. For each case, the surface roughness of the straight trunk part upper region and the straight trunk part lower region are indicated in Table 1. All of these lift pins were made of glassy carbon.

TABLE 1

| | Lift pin | |
|---|---|---|
| | Surface roughness of straight trunk part upper region (µm) | Surface roughness of straight trunk part lower region (µm) |
| Example 1 | 0.2 | 1 |
| Example 2 | 0.2 | 2 |
| Example 3 | 0.15 | 1 |
| Example 4 | 0.3 | 1 |
| Comparative Example 1 | 0.2 | 0.2 |
| Comparative Example 2 | 0.2 | 0.7 |
| Comparative Example 3 | 0.5 | 1 |
| Comparative Example 4 | 1 | 1 |

Lift Pin Ascending/Descending Defective Motion Observation Experiment

The lift pins prepared for Examples 1 to 4 and Comparative Examples 1 to 4 were respectively applied to the epitaxial growth device 1 illustrated in FIG. 2, and subjected to the motion observation experiment for observing whether or not defective motion occurred, when the lift pins were ascended and descended in a state of placing the silicon wafer W on the susceptor. This motion observation experiment was conducted at room temperature with the upper dome 11 of the epitaxial growth device 1 being open, and occurrence of defective motion was visually observed. The number of the ascending/descending motions was 100 times, counting a round-strip motion as one.

Figure 4:
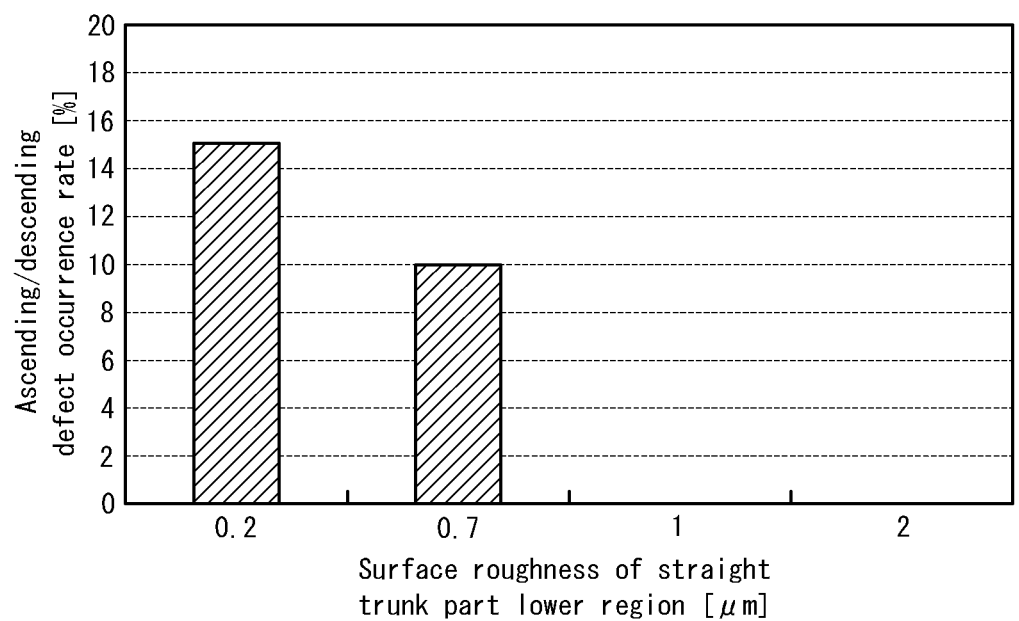
FIG. 4 is a view illustrating a relationship between the surface roughness of the straight trunk part lower region of a lift pin to be passed through a through-hole of a supporting arm and the ascending/descending defect occurrence rate.

FIG. 4 illustrates a relationship between the surface roughness of the straight trunk part lower region and the ascending/descending defect occurrence rate. As apparent from FIG. 4, the ascending/descending defect occurrence rate of the lit pin decreased as the surface roughness of the straight trunk part lower region increased, and when the surface roughness was not less than 1 µm, no defects occurred in the ascending/descending motion of the lift pins. Contrarily, when the surface roughness of the straight trunk part lower region was less than 1 µm, defects were observed in the ascending/descending motion of the lift pins. Thus, it is clear that occurrence of defects in the ascending/descending motion of the lift pins can be prevented, when the surface roughness of the straight trunk part lower region is not less than 1 µm.

Epitaxial Wafer Production Experiment 1

Epitaxial wafers were produced by applying the lift pins for Examples 1 and 2, and Comparative Examples 1 and 2 to the epitaxial growth device 1 illustrated in FIG. 2. Here, as the susceptor 4, a carbon base material coated with SiC on the surface was used. Moreover, as the substrate of epitaxial wafers, a boron doped silicon wafer W having a diameter of 300 mm was used.

For producing an epitaxial wafer, firstly the silicon wafer W was introduced into the epitaxial growth device 1, and placed on the susceptor 4 using the lift pins 15. Then, hydrogen baking was performed under a hydrogen gas atmosphere at a temperature of 1150° C., and a silicon epitaxial film was grown on the surface of the silicon wafer W by 4 µm at 1150° C., to obtain an epitaxial silicon wafer. Here, trichlorosilane gas was used as a raw material source gas, diborane gas as a dopant gas, and hydrogen gas as a carrier gas. For each of the Examples and Comparative Examples, 50 epitaxial wafers were produced.

Evaluation of Surface Quality

For the obtained epitaxial wafers, the number of epitaxial defects formed in the epitaxial layer was evaluated. Specifically, the epitaxial layer surface was observed and evaluated using a surface defect inspection device, manufactured by KLA-Tencor: Surfscan SP-2, in DWO mode (Dark Field Wide Oblique mode), and an occurrence state of LPD (Light Point Defect) having a size or diameter not less than 0.25 µm was examined. This evaluation was carried out on each set of 50 wafers prepared for Examples 1 and 2, and Comparative Examples 1 and 2, and the number of LPDs per wafer was obtained. The results were that for Examples 1 and 2 in which the surface roughness of the straight trunk part lower region was more than 1 µm, sudden LPD increase was not observed, and it can be assumed that defects did not occur in the ascending/descending motion of the lift pins. For these Examples 1 and 2, the number of LPDs observed in all the produced epitaxial wafers was not more than 1/wf.

Contrarily, for Comparative Examples 1 and 2 in which the surface roughness of the straight trunk part lower region was less than 1 μm, sudden LPD increase was observed, and it can be assumed that defects occurred in the ascending/descending motion of the lift pins. For these Comparative Examples 1 and 2, the number of epitaxial wafers having more than 10 LPDs/wf observed was 2 for Comparative Example 1, and 2 for Comparative Example 2.

Epitaxial Wafer Production Experiment 2

Similarly to Examples 1 and 2, and Comparative Examples 1 and 2, epitaxial wafers were produced by applying the lift pins for Examples 3 and 4, and Comparative Examples 3 and 4 to the epitaxial growth device 1 illustrated in FIG. 2. Here, the production conditions were all the same as the cases of Examples 1 and 2, and Comparative Examples 1 and 2.

Figure 5:
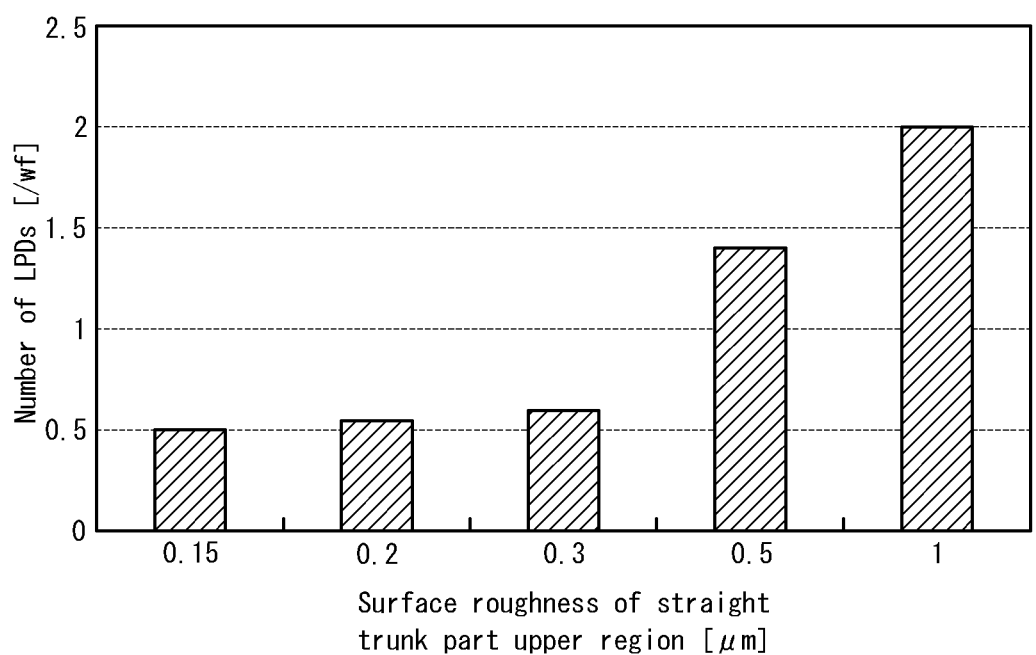
FIG. 5 is a view illustrating a relationship between the surface roughness of the straight trunk part upper region of a lift pin configured to pass through a through-hole of a susceptor and average number of LPDs per wafer.

When the above epitaxial wafers were produced, for any of Examples 3 and 4, and Comparative Examples 3 and 4, since the surface roughness of the straight trunk part lower region was not less than 1 μm, sudden LPD increase was not observed. FIG. 5 illustrates a relationship between the surface roughness of the straight trunk part upper region and the average number of LPDs per wafer, regarding Examples 1, 3, and 4, and Comparative Examples 3 and 4. From FIG. 5, it is clear that Example 1 having the surface roughness: 0.15 μm, Example 3 having the surface roughness: 0.2 μm, and Example 4 having the surface roughness: 0.3 μm, in which the surface roughness of the straight trunk part upper region of each lift pin was not more than 0.3 μm, achieved the average number of LPDs not more than 1/wf, while Comparative Example 3 having the surface roughness: 0.5 μm and Comparative Example 4 having the surface roughness: 1 μm, in which the surface roughness of the straight trunk part upper region of each lift pin was more than 0.3 μm, could not achieve the average number of LPDs not more than 1/wf.

INDUSTRIAL APPLICABILITY

This disclosure can reduce occurrence of scratches to the epitaxial silicon wafer back surface, and also reduce attachment of particles to the wafer surface, and thus is useful in the industry of semiconductor wafer production.

REFERENCE SIGNS LIST 1, 100 Epitaxial growth device
2 Chamber
4 Susceptor
4h, 7h, 17h Through-hole
4s, 17s Wall surface
4w Diametrically enlarged part
5, 15 Lift pin
6 Ascending/descending shaft
7 Supporting shaft
7a, 17a Main column
7b. 17b Supporting arm
11 Upper dome
12 Lower dome
13 Dome mounting body
14 Heat lamp
15a Straight trunk part
15b Head part
15c Straight trunk part lower region
15d Straight trunk part upper region
31 Gas supply opening
32 Gas exhaust opening
W Silicon wafer

The invention claimed is:

1. An epitaxial growth device comprising:
a chamber;
a susceptor for placing a silicon wafer thereon within the chamber;
a supporting shaft for supporting the susceptor from below, having a main column located coaxially with a center of the susceptor and supporting arms radially extending from the main column; and
lift pins configured to be inserted through both through-holes provided in the susceptor and through-holes provided in the supporting arms, and arranged movably in a vertical direction so that the silicon wafer is attached and detached on the susceptor by ascending and descending the lift pins, each of the lift pins having a rod-shaped straight trunk part and a head part having a diameter larger than the straight trunk part and the through-hole of the susceptor, wherein
a straight trunk part lower region has a surface roughness larger than a surface roughness of a straight trunk part upper region,
at least a surface layer region of each of the lift pins is made of glassy carbon having a hardness lower than a hardness of the susceptor,
the straight trunk part of each of the lift pins comprises the straight trunk part upper region configured to pass through the through-hole of the susceptor and having the surface roughness of from not less than 0.1 um to not more than 0.3 um, and
the straight trunk part of each of the lift pins comprises the straight trunk part lower region configured to pass through the through-hole of the supporting arm and having the surface roughness of from not less than 1 um to not more than 10 um.

2. The epitaxial growth device according to claim 1, wherein at least the surface layer region of each of the lift pins is made of glassy carbon, at least a surface layer region of the susceptor is made of silicon carbide, and the supporting arm is made of quartz.

3. The epitaxial growth device according to claim 1 or 2, wherein each of the lift pins comprises a rounded lower end part.

4. The epitaxial growth device according to claim 1, wherein the straight trunk part upper region has a surface roughness of 0.15 um to 0.3 um.

5. The epitaxial growth device according to claim 1, wherein the straight trunk part lower region has a surface roughness of 1 μm to 2 μm.

* * * * *